United States Patent
Zhang et al.

(10) Patent No.: US 9,543,299 B1
(45) Date of Patent: Jan. 10, 2017

(54) P-N BIMODAL CONDUCTION RESURF LDMOS

(71) Applicant: Texas Instruments Incorporated, Dallas, TX (US)

(72) Inventors: Yongxi Zhang, Plano, TX (US); Sameer P. Pendharkar, Allen, TX (US); Henry Litzmann Edwards, Garland, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 14/861,912

(22) Filed: Sep. 22, 2015

(51) Int. Cl.
*H01L 27/092* (2006.01)
*H01L 29/08* (2006.01)
*H01L 29/78* (2006.01)

(52) U.S. Cl.
CPC ......... *H01L 27/092* (2013.01); *H01L 29/0878* (2013.01); *H01L 29/7817* (2013.01)

(58) Field of Classification Search
CPC .................... H01L 29/66613; H01L 29/66681; H01L 29/7816; H01L 29/7824
See application file for complete search history.

(56) References Cited

U.S. PATENT DOCUMENTS

| | | | | |
|---|---|---|---|---|
| 6,727,127 B1 * | 4/2004 | Darmawan | ......... | H01L 29/7835 257/E21.427 |
| 6,833,586 B2 * | 12/2004 | Tsuchiko | ............... | H01L 29/086 257/343 |
| 9,076,863 B2 * | 7/2015 | Tamura | ................ | H01L 29/7816 |
| 9,087,708 B2 * | 7/2015 | Lin | ..................... | H01L 29/0646 |
| 9,196,728 B2 * | 11/2015 | Sridhar | ............... | H01L 29/7835 |
| 2004/0251492 A1 * | 12/2004 | Lin | ..................... | H01L 29/7816 257/335 |
| 2011/0127602 A1 * | 6/2011 | Mallikarjunaswamy | ................... | H01L 21/823807 257/331 |
| 2013/0015523 A1 * | 1/2013 | You | ..................... | H01L 27/0922 257/343 |
| 2013/0320443 A1 * | 12/2013 | Levin | ..................... | H01L 27/088 257/337 |

OTHER PUBLICATIONS

Zhang, Yongxi; U.S. Appl. No. 14/578,710, filed Dec. 22, 2014 for "High Voltage Multiple Channel LDMOS," 77 pages.
Zhang, Yongxi; U.S. Appl. No. 14/671,572, filed Mar. 27, 2015 for "Diluted Drift Layer With Variable Stripe Widths for Power Transistors," 27 pages.
F. Udrea; A. Popescu; W.I. Milne, "3D RESURF double-gate MOSFET: A revolutionary power device concept," Electronics Letters, Apr. 16, 1998, vol. 34, No. 8, pp. 808-809.

* cited by examiner

*Primary Examiner* — Mohsen Ahmadi
(74) *Attorney, Agent, or Firm* — Tuenlap D. Chan; Frank D. Cimino

(57) ABSTRACT

RESURF-based dual-gate p-n bimodal conduction laterally diffused metal oxide semiconductors (LDMOS). In an illustrative embodiment, a p-type source is electrically coupled to an n-type drain. A p-type drain is electrically coupled to an n-type source. An n-type layer serves as an n-type conduction channel between the n-type drain and the n-type source. A p-type top layer is disposed at the surface of the substrate of said semiconductor device and is disposed above and adjacent to the n-type layer. The p-type top layer serves as a p-type conduction channel between the p-type source and the p-type drain. An n-gate controls current flow in the n-type conduction channel, and a p-gate controls current flow in the p-type conduction channel.

11 Claims, 3 Drawing Sheets

P-N BIMODAL CONDUCTION RESURF LDMOS

BACKGROUND

Modern digital very-large-scale integration (VLSI) circuits commonly operate at supply voltages of around 2.5 volts or below. However, certain integrated circuits (ICs) call for additional on-chip circuits operating at higher voltages. Examples of such high-voltage circuits include input/output (IO) interface circuits with various off-chip system components such as power management switches, analog input circuits conditioning transducer signals, or output analog drive functions for speakers or other actuators.

In order to accommodate different voltage levels, some integrated circuits make use of multiple different gate oxide thicknesses to build both low voltage transistors and high voltage transistors on the same IC chip. However, this method increases process complexity and cost. An alternative solution is to use lateral asymmetric source and drain MOS transistors having a lightly doped n-type gap between the drain and gate (for n-type devices) to enable use of higher drain to source voltages, such as laterally diffused Metal-Oxide-Semiconductor (LDMOS) or drain-extended MOS (DeMOS) which have drain structures capable of operating at higher voltages as compared to conventional symmetric MOS transistors.

In an LDMOS transistor, a lightly doped lateral diffused drain region is constructed between the heavily doped drain contact and the transistor channel region. As the name implies, a lateral current is created between drain and source. A depletion region forms in this lightly doped lateral diffused region resulting in a voltage drop between the drain contact and the transistor gate. With proper design, sufficient voltage may be dropped between the drain contact and the gate dielectric to allow a low gate voltage transistor to be used as a switch for the high voltage.

Some lateral power transistors include "RESURF" regions, which is short for reduced surface electric field regions. For purposes of this patent application, the term "RESURF" is understood to refer to a material which reduces an electric field in an adjacent surface semiconductor region. A RESURF region may be for example a buried semiconductor region (or layer) with an opposite conductivity type from the adjacent semiconductor region (or layer). RESURF structures are described in Appels, et. al., "Thin Layer High Voltage Devices" Philips J, Res. 35 1-13, 1980. The RESURF region(s) for lateral power transistors are generally referred to as buried drift regions.

It is desirable for a power transistor such as an LDMOS to be as close to a perfect switch as possible, i.e., as close to zero resistance in the ON state and an open circuit in the OFF state as possible. Because minimizing die area is crucial to minimizing costs, a key metric for an LDMOS transistor is its specific on-resistance $R_{sp}$. The specific on-resistance $R_{sp}$ is defined as the drain-to-source resistance of the transistor in a given amount of area when the transistor is on. Thus $R_{sp}$ can be expressed as $R_{sp}=R_{ds(ON)}\cdot Area$, where $R_{ds(ON)}$ is the drain-to-source on-resistance (the resistance of the LDMOS device in its triode region), and Area is the size of the device. For a switch having a given on-resistance, lower $R_{sp}$ LDMOS can consume less silicon area.

SUMMARY

Illustrative embodiments of this disclosure are directed to RESURF-based dual-gate p-n bimodal-conduction laterally-diffused metal oxide semiconductors (LDMOS). In certain illustrative embodiments, a p-type source is electrically coupled to an n-type drain. A p-type drain is electrically coupled to an n-type source. An n-type layer serves as an n-type conduction channel between the n-type drain and the n-type source. A p-type top layer is disposed at the surface of the substrate of the semiconductor device and is disposed above and adjacent to the n-type layer. The p-type top layer serves as a p-type conduction channel between the p-type source and the p-type drain. An n-gate controls current flow in the n-type conduction channel, and a p-gate controls current flow in the p-type conduction channel.

In other illustrative embodiments, an n-type source is electrically coupled to a p-type drain. An n-type drain is electrically coupled to a p-type source. A p-type layer serves as a p-type conduction channel between the p-type source and the p-type drain. An n-type top layer is disposed above and adjacent to the p-type layer. The n-type top layer serves as an n-type conduction channel between the n-type drain and the n-type source. The n-gate controls current flow in the n-type conduction channel, and the p-gate controls current flow in the p-type conduction channel.

DETAILED DESCRIPTION

Figure 1:
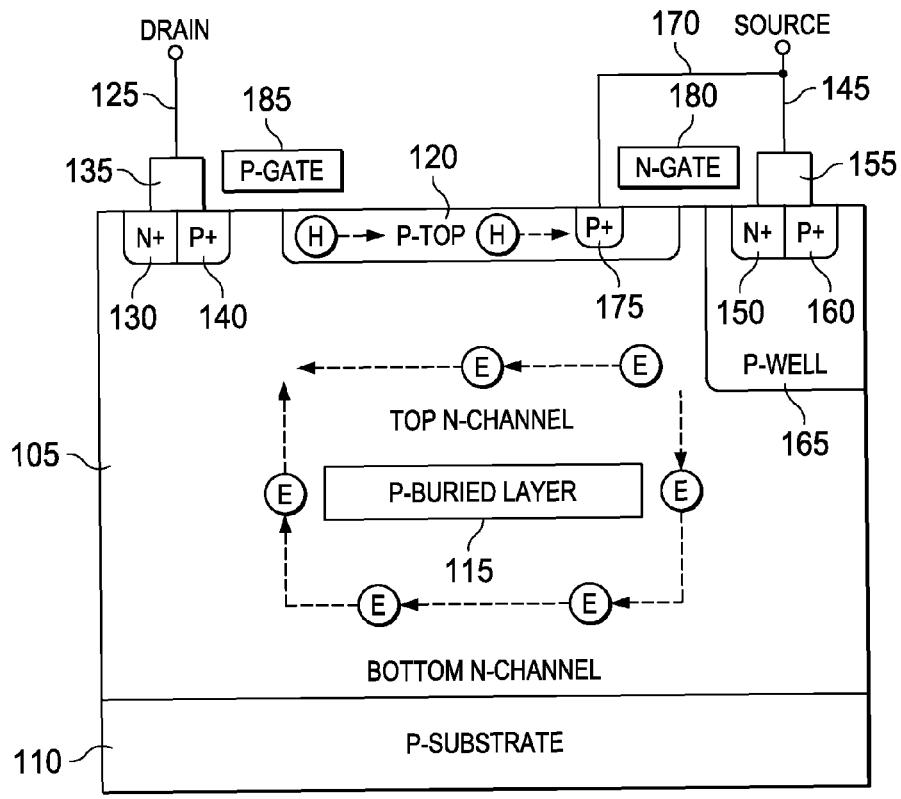
FIG. 1 is a cross-sectional view of a RESURF-based dual-gate laterally diffused metal oxide semiconductor (LDMOS) integrated circuit with p-n bimodal conduction.

Example embodiments are described with reference to the drawings, wherein like reference numerals are used to designate similar or equivalent elements. Illustrated ordering of acts or events should not be considered as limiting, as some acts or events may occur in different order and/or concurrently with other acts or events. Furthermore, some illustrated acts or events may not be required to implement a methodology in accordance with this disclosure.

FIG. 1 is a cross-sectional view of a RESURF-based double-gate laterally diffused metal oxide semiconductor (LDMOS) integrated circuit 100 with p-n bimodal conduction. The LDMOS integrated circuit 100 comprises an n-type LDMOS transistor having a p-type transistor embedded therein. The n-type transistor of the LDMOS integrated circuit 100 will at times be referred to herein as an NMOS device. Similarly, the p-type transistor of the LDMOS integrated circuit 100 will at times be referred to herein as a PMOS device. The LDMOS integrated circuit 100 includes an n-type region 105 formed over a p-type substrate 110, and a p-type layer 115, sometimes referred to as a RESURF layer, buried within the n-type region 105. As used herein, a "p-type" region or layer refers to a region or layer that is positively doped, i.e., doped with a positive charge, while an "n-type" region or layer refers to a region or layer that is negatively doped, i.e., doped with a negative charge. A p-type top layer 120 of the LDMOS device 100 is formed on top of the n-type region 105 and serves as a RESURF region. As mentioned, the p-type buried layer 115 and the p-type top layer 120 function as RESURF regions, which means they serve to reduce an electric field in their respective adjacent n-type regions 105.

A drain electrode 125 is coupled to a highly negatively doped (n+) implant 130 that is embedded in the n-type region 105. The drain electrode 125 serves as the drain of the n-type LDMOS transistor of the integrated circuit 100. The drain electrode 125 of the n-type transistor is also electrically coupled to a second electrical contact 135 that is coupled to a highly positively doped (p+) implant 140, or region, that is embedded in the n-type region 105. The second contact 135 serves as the source of the PMOS transistor that is embedded in the integrated circuit 100. The source of the PMOS transistor will at times be referred to herein as the p-source 135.

A source electrode 145 is coupled to a highly negatively doped (n+) implant 150 that is embedded in a p-type well 165 within the n-type region 105. The source electrode 145 serves as the source of the n-type LDMOS transistor of the integrated circuit 100. The source electrode 145 of the n-type transistor is also electrically coupled to a second electrical contact 170 that is coupled to a highly positively doped (p+) implant 175 that is embedded in the top p-type layer 120. The second contact 170 forms the drain of the PMOS transistor that is embedded in the integrated circuit 100. The p-type top RESURF region 120 thus serves as a drain extension of the PMOS. Said second contact 170 constituting the drain of the p-type transistor will at times be referred to herein as the p-drain. In an illustrative embodiment, the source electrode 145 of the n-type transistor is also electrically coupled to a third electrical contact 155 that is coupled to a highly positively doped (p+) implant 160 that is embedded in the p-well 165. The third contact 155 forms part of the drain of the PMOS transistor, together with the drain contact 170 coupled to the top p-type layer 120. In such an embodiment, the buried p-type RESURF region 115 thus serves as a further drain extension of the PMOS.

The voltage present at the n-gate 180 controls the current flow from the drain 125 to the source 145 of the n-type LDMOS transistor of the integrated circuit 100. The drain-to-source current $I_{ds-n}$ of the n-type transistor comprises electrons flowing from the source 145 to the drain 125 in the top and bottom channels of the n-type region 105, as shown in FIG. 1.

The voltage present at the p-gate 185 controls the current flow from the source 135 of the p-type transistor to the drain 170 of the p-type transistor of the integrated circuit 100. In an illustrative embodiment, the source-to-drain current $I_{sd-p}$ of the p-type transistor comprises holes flowing from the p-source 135 to the p-drain 170 in the top p-type layer 120, as shown in FIG. 1. This flow of electrons in one channel (the n-region 105) and the flow of holes in the opposite direction in another channel (the top p-type layer 120) is referred to herein as p-n bimodal conduction. It is important to note that the bimodal conduction is still unipolar conduction, with the electron and hole flows confined in separate conduction paths.

In an illustrative embodiment, the source-to-drain current $I_{sd-p}$ further comprises holes flowing from the p-source 135 to the p-drain 155 in the buried p-type layer 115. In an illustrative embodiment, the integrated circuit 100 includes, at spaced intervals in the device width direction (i.e., the $3^{rd}$ dimension of FIG. 1) of the LDMOS device 100, positively doped regions (not shown in FIG. 1) connecting the buried p-type layer 115 to the p-well 165, in order to facilitate current flow between the p-drain 155 and the buried p-type layer 115. For example, in one embodiment such p-type regions are placed at intervals of approximately every 20 μm in the width direction of the LDMOS device 100. Placing these p-type regions at spaced intervals as opposed to having a continuous connection between the buried p-type layer 115 and the p-well 165 allows current (in the form of holes) to flow between the p-drain 155 and the buried p-type layer 115 while still allowing current (in the form of electrons) to flow in the n-type region 105 between the source 145 and the bottom channel. Similarly, in an illustrative embodiment, the integrated circuit 100 also includes, at spaced intervals in the width direction, positively doped regions (not shown in FIG. 1) connecting the buried p-type layer 115 to the top p-type layer 120 proximate the p-source 135, in order to facilitate current flow between the p-source 135 and the buried p-type layer 115. Placing these p-type regions at spaced intervals as opposed to having a continuous connection between the buried p-type layer 115 and the top p-type layer 120 allows current (in the form of holes) to flow between the p-source 135 and the buried p-type layer 115 while still allowing current (in the form of electrons) to flow in the n-type region 105 between the drain 125 and the top channel. These vertical diffusion connections must be carefully designed to avoid localized premature breakdown in the OFF state.

The high voltage p-n bimodal LDMOS integrated circuit 100 can block voltage only when both the n-channel 105 and p-channel 120 are turned off. The device 100 can be used as an NMOS transistor when the n-channel is on (conducting), as a PMOS transistor when the p-channel is on, or as a synchronized switch when both channels are on simultaneously. When both the n-channel and p-channel are conducting simultaneously, the total drain-to-source current flow $I_{ds-pn}$ of the bimodal LDMOS device 100 is equal to the sum of the net drain-to-source current $I_{ds-n}$ of the n-type LDMOS plus the net source-to-drain current $I_{sd-p}$ of the slave PMOS. Thus the total drain-to-source current $I_{ds-pn}$ of the bimodal LDMOS integrated circuit 100 is enhanced, both in the linear region of the $I_{ds}$ curve and in the saturation region. With electron flow in the n-drift region 105 and hole flow in the p-type (RESURF) region 120, p-n conduction in parallel reduces the specific on-resistance $R_{sp}$ and improves drive current. In the illustrative embodiment wherein the buried p-type RESURF layer 115 is used as a further drain extension of the slave PMOS by periodically forming vertical p-type connections in the device width direction, bimodal p-n conduction is further enhanced.

Figure 2:
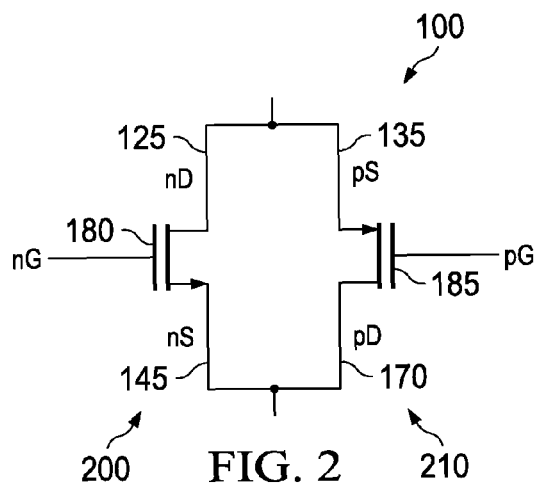
FIG. 2 is a schematic circuit diagram of a dual-gate p-n bimodal conduction LDMOS transistor.

FIG. 2 is a schematic circuit diagram of a dual-gate p-n bimodal conduction LDMOS transistor. The dual-gate LDMOS transistor 100 of FIG. 2 illustratively corresponds to the LDMOS integrated circuit of FIG. 1. Thus elements common to FIGS. 1 and 2 are identified with like reference numbers. The LDMOS dual-gate p-n transistor 100 of FIG. 2 comprises an NMOS transistor 200 and a PMOS transistor 210. NMOS transistor 200 comprises a drain terminal 125, source terminal 145, and a gate terminal 180. The voltage present at the gate terminal 180 dictates in part the flow of current from the drain 125 to the source 145, as is described above with respect to FIG. 1. PMOS transistor 210 comprises a source terminal 135, drain terminal 170, and a gate terminal 185. The voltage present at the gate terminal 185 dictates in part the flow of current from the source 135 to the drain 170, as is described above with respect to FIG. 1. The drain 125 of the NMOS transistor 200 is coupled to the source 135 of the PMOS transistor 210, and the source 145 of the NMOS transistor 200 is coupled to the drain 170 of the PMOS transistor 210. Thus the total current flow from the node comprising the n-drain 125 and the p-source 135, to the node comprising the n-source 145 and the p-drain 170, is $I_{ds-n}+I_{sd-p}$, i.e., the sum of the drain-to-source current $I_{ds-n}$ of the NMOS device 200 and the source-to-drain current $I_{sd-p}$ of the PMOS device 210.

Figure 3:
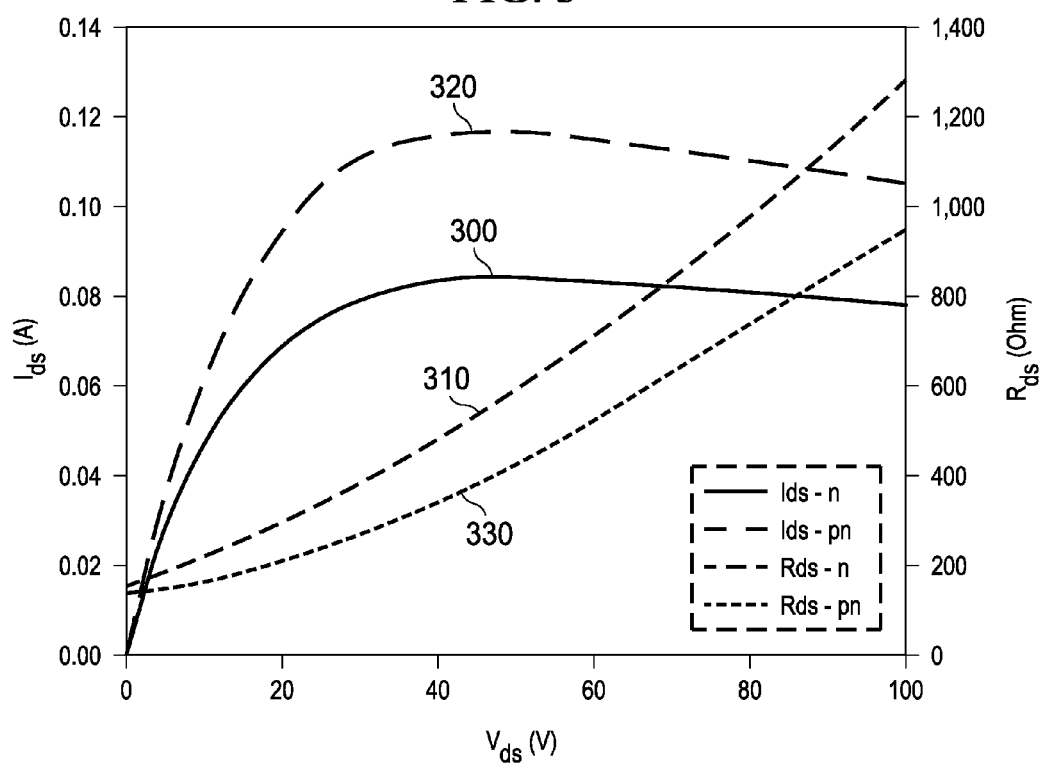
FIG. 3 is graph representing drain-to-source current and drain-to-source resistance as a function of drain-to-source voltage $V_{ds}$ at maximum gate biases for an illustrative dual-gate, bimodal conduction LDMOS.

FIG. 3 is graph representing drain-to-source current $I_{ds}$ and drain-to-source resistance $R_{ds}$ as a function of drain-to-source voltage $V_{ds}$ at maximum gate biases for a dual-gate, bimodal conduction LDMOS such as that shown in FIG. 1. Plot 300 represents the on-state drain-to-source current $I_{ds-n}$ when the dual-gate, bimodal conduction LDMOS 100 when the device is operated as an NMOS device, i.e., when the voltage at the n-gate 180 causes the n-channel 105 to conduct while the voltage at the p-gate 185 causes the p-channel 120 to be turned off. Plot 310 represents the associated on-state drain-to-source resistance $R_{ds-n}$ when the LDMOS integrated circuit 100 is operated as an NMOS device. Plot 320 represents the on-state drain-to-source current $I_{ds-pn}$ when the dual-gate, bimodal conduction LDMOS 100 when the device is operated as a bimodal conduction p-n device, i.e., when the voltage at the n-gate 180 causes the n-channel 105 to conduct while the voltage at the p-gate 185 simultaneously causes the p-channel 120 to conduct. Note that when referring to the drain-to-source current $I_{ds-pn}$ of the p-n bimodal LDMOS 100, this refers to the current flowing from the drain 125 of the NMOS transistor 200 (which is coupled to the source of the PMOS transistor 210) to the source 145 of the NMOS transistor 200 (which is coupled to the drain 170 of the PMOS transistor 210). Plot 330 represents the associated on-state drain-to-source resistance $R_{ds-pn}$ when the LDMOS integrated circuit 100 is operated as a bimodal conduction p-n device. As can be seen in FIG. 3, $I_{ds}$ for both the unimodal NMOS conduction mode 300 and the bimodal p-n conduction mode 320 increases in a substantially linear fashion until the device saturates (between 20V and 40V for the illustrative device represented by FIG. 3). Similarly, the on-resistance $R_{ds}$ for both the unimodal NMOS conduction mode 310 and the bimodal p-n conduction mode 330 increases quite linearly until the device saturates. As can be seen in FIG. 3, operating the LDMOS device 100 as a bimodal p-n device significantly enhances $I_{ds}$, and therefore reduces $R_{ds}$, in both the linear region and the saturation region.

Specific on-resistance $R_{sp}$ for a power device is usually measured at very low $V_{ds}$, where the device operates in the linear region. However, the maximum output current in power switching circuits is determined by the saturation drain-to-source current $I_{ds,sat}$, defined at the saturation voltage $V_{ds,sat}$, and the thermal dissipation. Also, the on-state current and corresponding drain-to-source voltage $V_{ds}$ for a power switch varies with different load conditions. Therefore, it is desirable to have a smaller slope for the linear plot of $R_{ds}$ vs. $V_{ds}$ when the switch is on. As can be seen in FIG. 3, the p-n bimodal conduction enhances the drive current by at least 30% at $V_{ds}$ of 20V compared to n-type conduction only. With the slave p-gate 185 fully on, the $R_{ds-pn}$ 330 dependence on $V_{ds}$ before the device saturates is minimized with a slope of 2.5% increase per volt, which can lead to lower conduction loss and lower thermal dissipation. In contrast, the $R_{ds-n}$ 310 of n-conduction LDMOS increases with $V_{ds}$ at a rate of approximately 5% per volt.

Figure 4:
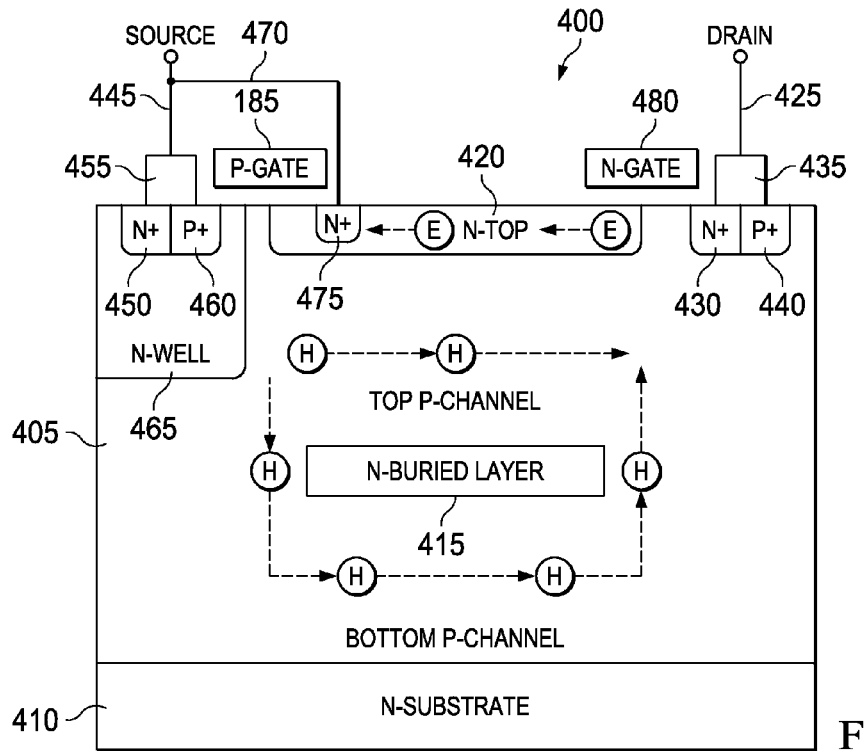
FIG. 4 is a cross-sectional view of a RESURF-based dual-gate LDMOS integrated circuit with p-n bimodal conduction.

FIG. 4 is a cross-sectional view of a RESURF-based dual-gate LDMOS integrated circuit 400 with p-n bimodal conduction. The LDMOS integrated circuit 400 comprises a p-type LDMOS transistor having an n-type transistor embedded therein. In that sense, the LDMOS device 400 is the inverse of the LDMOS device 100 of FIG. 1, which comprises an n-type LDMOS transistor having a p-type transistor embedded therein. The p-type transistor of the LDMOS integrated circuit 400 will at times be referred to herein as a PMOS device. Similarly, the n-type transistor of the LDMOS integrated circuit 100 will at times be referred to herein as an NMOS device. The LDMOS integrated circuit 400 includes a p-type region 405 formed over an n-type substrate 410, and an n-type RESURF layer 415 buried within the p-type region 405. An n-type top layer 420 of the LDMOS device 400 is formed on top of the p-type region 405 and serves as a RESURF region. As mentioned, the n-type buried layer 415 and the n-type top layer 420 function as RESURF regions, which means they serve to reduce an electric field in their respective adjacent p-type regions 405.

A drain electrode 425 is coupled to a highly positively doped (p+) implant 440 that is embedded in the p-type region 405. The drain electrode 425 serves as the drain of the p-type LDMOS transistor of the integrated circuit 400. The drain electrode 425 of the p-type transistor is also electrically coupled to a second electrical contact 435 that is coupled to an n+ implant 430, or region, that is embedded in the p-type region 405. The second contact 435 serves as the source of the NMOS transistor that is embedded in the integrated circuit 400. The source of the NMOS transistor will at times be referred to herein as the n-source 435.

A source electrode 445 is coupled to a p+ implant 460 that is embedded in an n-type well 165 within the n-type region 405. The source electrode 445 serves as the source of the p-type LDMOS transistor of the integrated circuit 400. The source electrode 445 of the n-type transistor is also electrically coupled to a second electrical contact 470 that is coupled to an n+ implant 475 that is embedded in the top n-type layer 420. The second contact 470 forms the drain of the NMOS transistor that is embedded in the integrated circuit 400. The n-type top RESURF region 420 thus serves as a drain extension of the NMOS. The second contact 470 constituting the drain of the n-type transistor will at times be referred to herein as the n-drain. In an illustrative embodiment, the source electrode 445 of the p-type transistor is also electrically coupled to a third electrical contact 455 that is coupled to a highly negatively doped (n+) implant 450 that is embedded in the n-well 465. The third contact 455 forms part of the drain of the NMOS transistor, together with the drain contact 470 coupled to the top n-type layer 420. In such an embodiment, the buried n-type RESURF region 415 thus serves as a further drain extension of the NMOS.

The voltage present at the p-gate 485 controls the current flow from the source 445 to the drain 425 of the p-type LDMOS transistor of the integrated circuit 400. The source-to-drain current $I_{sd-p}$ of the p-type transistor comprises holes flowing from the source 445 to the drain 425 in the top and bottom channels of the p-type region 405, as shown in FIG. 4.

The voltage present at the n-gate 480 controls the current flow from the drain 470 of the n-type transistor to the source 435 of the n-type transistor of the integrated circuit 400. In an illustrative embodiment, the drain-to-source current $I_{ds-n}$ of the n-type transistor comprises electrons flowing from the n-source 435 to the n-drain 470 in the top n-type layer 420, as shown in FIG. 4.

In an illustrative embodiment, the drain-to-source current $I_{ds-n}$ further comprises electrons flowing from the n-source 435 to the n-drain 455 in the buried n-type layer 415. In an illustrative embodiment, the integrated circuit 400 includes, at spaced intervals in the device width direction (i.e., the 3$^{rd}$ dimension of FIG. 4) of the LDMOS device 400, positively doped regions (not shown in FIG. 4) connecting the buried n-type layer 415 to the n-well 465, in order to facilitate current flow between the n-drain 455 and the buried n-type layer 415. For example, in one embodiment such n-type regions are placed at intervals of approximately every 20 μm in the width direction of the LDMOS device 400. Placing these n-type regions at spaced intervals as opposed to having a continuous connection between the buried n-type layer 415 and the n-well 465 allows current (in the form of electrons) to flow between the n-drain 455 and the buried n-type layer 115 while still allowing current (in the form of holes) to flow in the p-type region 405 between the source 445 and the bottom p-channel. Similarly, in an illustrative embodiment, the integrated circuit 400 also includes, at spaced intervals in the device width direction, negatively doped regions (not shown in FIG. 1) connecting the buried n-type layer 415 to the top n-type layer 420 proximate the n-source 435, in order to facilitate current flow between the n-source 435 and the buried n-type layer 415. Placing these n-type regions at spaced intervals as opposed to having a continuous connection between the buried n-type layer 415 and the top n-type layer 420 allows current (in the form of electrons) to flow between the n-source 435 and the buried n-type layer 415 while still allowing current (in the form of holes) to flow in the p-type region 405 from the top p-channel to the drain 425.

Figure 5:
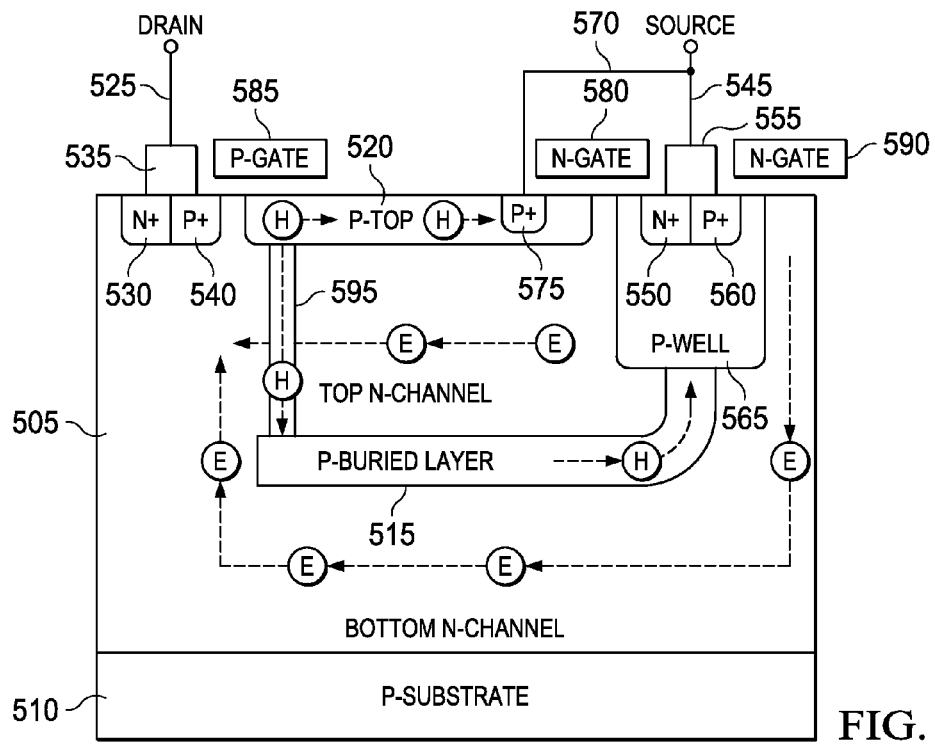
FIG. 5 is a cross-sectional view of a RESURF-based LDMOS integrated circuit having one p-gate and two n-gates with p-n bimodal conduction.

FIG. 5 is a cross-sectional view of a RESURF-based double-gate LDMOS integrated circuit 500 with p-n bimodal conduction. The LDMOS integrated circuit 500 is similar to the LDMOS integrated circuit 100 of FIG. 1 but includes two n-gates 580, 590 and a continuous connection between the p-buried layer 515 and the p-well 565. The LDMOS integrated circuit 100 comprises an n-type LDMOS transistor having a p-type transistor embedded therein. The LDMOS integrated circuit 500 includes an n-type region 505 formed over a p-type substrate 510, and a p-type RESURF layer 515 buried within the n-type region 505. A p-type top layer 520 of the LDMOS device 500 is formed on top of the n-type region 505 and serves as a RESURF region.

A drain electrode 525 is coupled to a highly negatively doped (n+) implant 530 that is embedded in the n-type region 505. The drain electrode 525 serves as the drain of the n-type LDMOS transistor of the integrated circuit 500. The drain electrode 525 of the n-type transistor is also electrically coupled to a second electrical contact 535 that is coupled to a highly positively doped (p+) implant 540, or region, that is embedded in the n-type region 505. The second contact 535 serves as the source of the PMOS transistor that is embedded in the integrated circuit 500.

A source electrode 545 is coupled to an n+ implant 550 that is embedded in a p-type well 565 within the n-type region 505. The source electrode 545 serves as the source of the n-type LDMOS transistor of the integrated circuit 500. The source electrode 545 of the n-type transistor is also electrically coupled to a second electrical contact 570 that is coupled to a p+ implant 575 that is embedded in the top p-type layer 520. The second contact 570 forms the drain of the PMOS transistor that is embedded in the integrated circuit 500. The p-type top RESURF region 520 thus serves as a drain extension of the PMOS. The second contact 570 constituting the drain of the p-type transistor will at times be referred to herein as the p-drain. In an illustrative embodiment, the source electrode 545 of the n-type transistor is also electrically coupled to a third electrical contact 555 that is coupled to a p+ implant 560 that is embedded in the p-well 565. The third contact 555 forms part of the drain of the PMOS transistor, together with the drain contact 570 coupled to the top p-type layer 520. In such an embodiment, the buried p-type RESURF region 515 thus serves as a further drain extension of the PMOS.

The voltage present at the p-gate 585 controls the current flow from the source 535 of the p-type transistor to the drain 570 of the p-type transistor of the integrated circuit 500. In the illustrative embodiment of FIG. 5, the source-to-drain current $I_{sd-p}$ of the p-type transistor comprises holes flowing from the p-source 535 to the p-drain 570 in both the top p-type layer 520 and in the buried p-type layer 515. As shown in FIG. 5, the buried p-type layer is continuously connected to the p-well 565 (as opposed to the spaced-apart connections described with respect to FIG. 1), in order to facilitate current flow between the p-drain 555 and the buried p-type layer 515. In an illustrative embodiment, the integrated circuit 500 also includes, at spaced intervals in the device width direction (i.e., the 3$^{rd}$ dimension of FIG. 5) of the LDMOS device 500, positively doped regions 595 connecting the buried p-type layer 515 to the top p-type layer 520 proximate the p-source 535, in order to facilitate current flow between the p-source 535 and the buried p-type layer 515. Placing these p-type regions at spaced intervals as opposed to having a continuous connection between the buried p-type layer 515 and the top p-type layer 520 allows current (in the form of holes) to flow between the p-source 535 and the buried p-type layer 515 while still allowing current (in the form of electrons) to flow in the n-type region 505 from the drain 525 to the top n-channel.

In an illustrative embodiment, the dopant concentration of the buried p-type layer 515 is variable, with the concentration being highest adjacent to the p-well 565 and gradually decreasing as the distance from the p-well 565 increases, to a minimum dopant concentration at the end of the buried p-type layer 515 most distal to the p-well 565, i.e., the end nearest the n-drain 525.

Because the LDMOS device 500 of FIG. 5 has a continuous connection between the buried p-type layer 515 and the p-well 565, this continuous connection forms a barrier between the n-gate 580 and the bottom channel of the n-type region 505. Therefore, the LDMOS integrated circuit 500 of FIG. 5 includes a second n-gate 590. The voltage present at the first n-gate 580 controls the current flow from the drain 525 to the source 545 via the top channel of the n-type region 505, while the second n-gate 590 controls the current flow from the drain 525 to the source 545 via the bottom channel of the n-type region 505. The drain-to-source current $I_{ds-n}$ of the n-type transistor comprises electrons flowing from the source 545 to the drain 525 in the top and bottom channels of the n-type region 505, as shown in FIG. 5.

It is noted that the embodiments disclosed herein are illustrative rather than limiting in nature and that a wide range of variations, modifications, changes, and substitutions are contemplated in the foregoing disclosure. Furthermore, in some instances, some features may be employed without a corresponding use of the other features. Accordingly, it is appropriate that the appended claims be construed broadly and in a manner consistent with the broad inventive concepts disclosed herein.

What is claimed is:

1. A laterally diffused metal oxide semiconductor (LDMOS) device comprising:
   an n-type drain;
   an n-type source;
   a p-type source electrically coupled to the n-type drain;
   a p-type drain electrically coupled to the n-type source;

an n-type layer operable to serve as an n-type conduction channel between the n-type drain and the n-type source;

a p-type top layer disposed above and adjacent to said n-type layer, said p-type top layer being operable to serve as a p-type conduction channel between the p-type source and the p-type drain;

an n-gate positioned closer to the n-type source than the n-type drain and operable to control current flow in the n-type conduction channel; and a p-gate positioned closer to the p-type source than the p-type drain and operable to control current flow in the p-type conduction channel.

2. The LDMOS device of claim 1, wherein said p-type top layer comprises a p-type RESURF layer.

3. The LDMOS device of claim 1, wherein:

said n-type drain is coupled to a first n+ implant embedded in said n-type layer;

said n-type source is coupled to a second n+ implant embedded in said n-type layer; and said p-type source is coupled to a first p+ implant embedded in said n-type layer.

4. The LDMOS device of claim 3, wherein said p-type drain is coupled to a second p+ implant embedded in said p-type top layer.

5. The LDMOS device of claim 4, further comprising a second p-type layer buried within said n-type layer and operable to serve as a second p-type conduction channel between the p-type source and the p-type drain.

6. The LDMOS device of claim 5, wherein said p-type buried layer comprises a p-type RESURF layer.

7. The LDMOS device of claim 5, wherein said second n+ implant is embedded in an isolated p-type well disposed within the n-type layer, and wherein said p-type drain is coupled to a third p+ implant embedded in said isolated p-type well.

8. The LDMOS device of claim 7, further comprising a vertical p-type region linking said buried p-type layer and said p-type top layer to enable conduction in said second p-type conduction channel between the p-type source and the p-type drain.

9. The LDMOS device of claim 8, further comprising a second vertical p-type region linking said buried p-type layer and said isolated p-type well to enable conduction in said second p-type conduction channel between the p-type source and the p-type drain.

10. A laterally diffused metal oxide semiconductor (LDMOS) device comprising:

an n-type metal oxide semiconductor (NMOS) transistor comprising:

an n-type drain;

an n-type source;

an n-type layer operable to serve as an n-type conduction channel between the n-type drain and the n-type source; and an n-gate positioned closer to the n-type source than the n-type drain and operable to control current flow in the n-type conduction channel; and a p-type metal oxide semiconductor (PMOS) transistor comprising:

a p-type source electrically coupled to the n-type drain of the NMOS transistor;

a p-type drain electrically coupled to the n-type source of the NMOS transistor;

a p-type top layer disposed above and adjacent to said n-type layer, said p-type top layer being operable to serve as a p-type conduction channel between the p-type source and the p-type drain; and a p-gate positioned closer to the p-type source than the p-type drain and operable to control current flow in the p-type conduction channel.

11. The LDMOS device of claim 10, wherein said p-type top layer comprises a p-type RESURF layer.

* * * * *